United States Patent
Holzl et al.

(10) Patent No.: US 7,513,961 B2
(45) Date of Patent: *Apr. 7, 2009

(54) HIGH STRENGTH ALLOYS AND METHODS FOR MAKING SAME

(76) Inventors: Robert A. Holzl, 5759 Briartree Dr., LaCanada, CA (US) 91011; Robert L. Shinavski, 22746 Fortuna La., Mission Viejo, CA (US) 92691

( * ) Notice: Subject to any disclaimer, the term of this patent is extended or adjusted under 35 U.S.C. 154(b) by 394 days.

This patent is subject to a terminal disclaimer.

(21) Appl. No.: 11/006,162

(22) Filed: Dec. 6, 2004

(65) Prior Publication Data

US 2005/0211341 A1    Sep. 29, 2005

Related U.S. Application Data

(63) Continuation of application No. 10/035,683, filed on Nov. 1, 2001, now Pat. No. 6,827,796.

(60) Provisional application No. 60/245,248, filed on Nov. 2, 2000, provisional application No. 60/246,637, filed on Nov. 7, 2000.

(51) Int. Cl.
  *C23C 16/08* (2006.01)
  *C23C 16/30* (2006.01)
(52) U.S. Cl. .................. 148/537; 427/249.18; 427/250; 427/255.7
(58) Field of Classification Search ................. 148/537; 427/249.18, 250, 255.7
See application file for complete search history.

(56) References Cited

U.S. PATENT DOCUMENTS 4,619,865 A * 10/1986 Keem et al. .................. 428/333

(Continued)

FOREIGN PATENT DOCUMENTS

EP    0411646    2/1991

(Continued)

*Primary Examiner*—George Wyszomierski
(74) *Attorney, Agent, or Firm*—Peters Verny, LLP

(57) ABSTRACT

A family of extremely fine-grained alloys are used to make coatings or free-standing bodies having desirable properties for use as a heat-resistant and wear-resistant material. In an illustrative embodiment, the alloys are comprised of a multiplicity of alternate, microcrystalline or nanocrystalline films of tungsten metal and tungsten compound. The tungsten compound film may be comprised of a tungsten carbide or a tungsten boride. The tungsten films are the primary films. Their desirable characteristics, in addition to their very fine crystalline habit, per se, are the high strength, high hardness, high resilience, and high fracture energy which these fine crystallites foster. They may be manufactured by a chemical vapor deposition process in which reactive gas flows are rapidly switched to produce alternate films with abrupt hetero-junctions and thereby to produce the useful micro-crystalline habit. The unique synthesis method allows effective control of critical flaw size. The structure is such that the primary films may be made sufficiently thick so as to assure some desirable ductile behavior, but sufficiently thin so as to have high yield strength by dint of their microcrystalline size, and as to limit the size of any flaws. The secondary films are made of enough thickness to prevent the epitaxial growth from one primary film to the next-deposited primary film and thin enough so that they can not contain a flaw of critical size. In addition, the exterior surface of any body made by this method may have a sufficiently smooth surface that the strength of the body is determined by the bulk properties of the material and not by surface flaws.

35 Claims, 3 Drawing Sheets

U.S. PATENT DOCUMENTS

| | | | | |
|---|---|---|---|---|
| 4,855,188 A | * | 8/1989 | Garg et al. | 428/627 |
| 5,015,265 A | * | 5/1991 | Corrigan et al. | 51/293 |
| 5,064,691 A | * | 11/1991 | Kirner et al. | 427/252 |
| 5,145,739 A | | 9/1992 | Sarin | |
| 5,538,816 A | * | 7/1996 | Hashimoto et al. | 430/5 |
| 5,759,906 A | | 6/1998 | Lou | |
| 6,551,929 B1 | * | 4/2003 | Kori et al. | 438/685 |
| 6,827,796 B2 | * | 12/2004 | Holzl et al. | 148/527 |
| 6,827,978 B2 | * | 12/2004 | Yoon et al. | 427/250 |
| 7,101,795 B1 | * | 9/2006 | Xi et al. | 438/685 |

FOREIGN PATENT DOCUMENTS

| | | |
|---|---|---|
| JP | 01321399 | 12/1989 |
| JP | 04351999 | 12/1992 |
| WO | WO 0047796 | 8/2000 |

\* cited by examiner

HIGH STRENGTH ALLOYS AND METHODS FOR MAKING SAME

CROSS-REFERENCE TO RELATED APPLICATIONS

The present application is a continuation application of Ser. No. 10/035,683 filed Nov. 1, 2001, now U.S. Pat. No. 6,827,796 entitled "High Strength Alloys and Methods for Making Same, which claims the benefit of priority from 35 USC 111(b) U.S. provisional application Ser. No. 60/245,248 filed Nov. 2, 2000 and which also claims the benefit of priority from 35 USC 111(b) U.S. provisional application Ser. No. 60/246,637 filed Nov. 7, 2000 and which is incorporated by reference herein.

REFERENCE TO GOVERNMENT

This invention was made with Government support under Contract No. F08630-98-C-0017 awarded by the Air Force Research Laboratory. The Government has certain rights in this invention.

FIELD OF THE INVENTION

This invention relates to heat-resistant, and wear-resistant alloys useful for coatings or free-standing bodies having favorable combinations of strength, hardness and/or toughness. It also relates to methods for making the alloys. More specifically, the invention relates to chemical vapor deposition processes and products therefrom, which have unique, substantially improved physical and mechanical characteristics.

BACKGROUND OF THE INVENTION

Group VIB transition metals include, for purposes of this application, tungsten, molybdenum and chromium. The Group VIB, transition metal elements, such as tungsten, molybdenum, and chromium, have characteristics that allow their incorporation into some new, high-performance alloys. Their high stiffness suggests that they have intrinsic high strength. This indicates that they should have high fracture energy and high specific resilience. It also suggests that they are capable of being made into hard and wear resistant alloys. They have high melting temperatures, as well. Unfortunately, the potentially superior mechanical properties of these materials are seldom realized because of their lack of toughness.

They are all used as pure metals and as important alloying species with base metals. As pure metals, or as the major species in alloys, tungsten and molybdenum are more important than chromium as structural materials. Chromium is used more frequently as a coating.

These Group VIB transition metals, such as tungsten, are used industrially as pure metals, sometimes containing small quantities of a finely divided dispersant; as an alloy with other high melting metals; or as a pure metal cemented into a body with small quantities of a lower melting metal matrix; or as a carbide, either pure or alloyed, cemented with a similar lower melting metal matrix. They are also used as a dilute alloying species in high strength and high hardness base metal alloys.

Among the most important applications of tungsten, for example, are for resistance wire as in lamp bulbs and vacuum tubes, extremely small conductors in microprocessors, x-ray targets, so-called heavy metal alloys, and cemented carbide tool and wear parts. The wire and x-ray target uses take advantage of tungsten's high melting temperature; the microprocessor use of its electrical conductivity and thermal expansion coefficient; the heavy metal alloys of its high specific gravity; and the cemented carbides of the hardness and wear resistance of its monocarbide.

In most instances, it is important for these Group VIB transition metals to have the highest strength and toughness, consistent with the maintenance of its other important properties.

Fine tungsten wire, for example, after the large amount of mechanical work which goes into its manufacture, exhibits high strength. Bulk metal parts of tungsten are usually much weaker, however. In all but a few instances, e.g., the fine wire, tungsten parts suffer from lack of toughness. Even the wire soon loses both strength and ductility on heating due to the work being a high driving force for re-crystallization and grain growth. The brittleness of x-ray targets and other larger bodies has been avoided, at considerable increase in cost, by the addition of the rare metal, rhenium, as an alloying species in quantities as high as twenty-five percent.

The heavy metal and cemented carbide parts rely on another approach to achieve acceptable toughness. They are made by pressing and sintering a mixture of pure metal powder, or of carbide powder, with a lower-melting, more ductile, base metal. The tungsten or tungsten carbide is thereby cemented by the small quantities of the ductile base metal.

Properties of the final product are achieved by the judicious selection of the matrix metal composition, the size of the metal powders, or the size and composition of the carbide powders. For many applications of tungsten and for most applications of tungsten carbide the base-metal-cemented, these pseudo-alloys are the only practical solutions. There are many instances, however, where the incorporation of the softer, lower-melting, less-stiff, and less corrosion-resistant cement substantially degrades the usefulness of the bodies. Pure tungsten, or alloys of tungsten with strengthening or hardening species which would not use such cement would be much more useful.

With regard to metals and other materials in general, it has been well known to materials engineers and scientists that refinement of the crystal habit of bodies increases yield strength, and hardness. Since ancient days mechanical working to reduce their grain size has strengthened metal parts. With more sophisticated understanding, the so-called Hall-Petch relationship has become generally accepted. This relationship teaches that the yield strength of materials varies inversely with the reciprocal of the square root of the grain size. In a more recent publication, Jundal and Armstrong (see Trans. AIME 1969 vol. 245, pg. 625) reported that the Hall-Petch relationship could be extended to treat the increase in material hardness with grain size reduction as well as yield strength. Additional verification, for the case of the hardness of tungsten, comes from Vashi, et al. (see Metallurgical Trans., Vol. 1, June 1970, pg. 1769-1771). (The entire contents of all publications and patents mentioned anywhere in this disclosure are hereby incorporated by reference.)

Within the last decade, research has demonstrated that the dramatic effects on properties can be extended in materials of much finer grain refinement than had been earlier possible. Progress in the manufacture of cemented tungsten carbide cutting tool materials discussed above is a particularly good example of such improvement. Two decades ago the most modern of these cemented carbides had WC crystallite sizes no smaller than about two microns. Today, they are made quite regularly, commercially, with 0.4 micron (400 nm) crystals; and even smaller, on an experimental basis. This has resulted in superior products from the point of view of strength and wear resistance.

This reduction in grain size is not accomplished without difficulty. There are practical limits to the fineness of powders which may be used in the pressing and sintering process. Very small powders have long been considered explosion and worker-ingestion hazards. Even more importantly, these powders tend to agglomerate in handling, thereby preventing the formation of a final product with a crystal refinement as small as might be desired.

Advances to reduce the agglomeration problems have been claimed to be effected by the use of a spray-reaction process from salts of tungsten and the matrix metal with subsequent gas-phase carburization. This process is described in U.S. Pat. Nos. 5,230,729 and 5,352,269. Further, however, even after these very fine powders have been pressed successfully to a so-called green body, there is a tendency toward grain growth upon sintering, although efforts have been made to alloy the cementing metals to allow lower temperature processing and to minimize this grain growth. This approach is described in U.S. Pat. No. 5,841,044.

For reasons which have not been totally explained, none of sub-micron-size or nanostructure cemented carbides, except those with grain sizes above about 0.4 µm, or even above 0.8 µm, has shown sufficiently good toughness to be generally accepted commercially.

In the materials science arena, however, investigators have become increasingly anxious to investigate the effects of nano-technology. Nano-technology is usually defined as dealing in microcrystalline sizes below 0.1 µm (100 nm). Because of the aforementioned limitations, and because they need only small samples, they have chosen to use deposition techniques to make their research samples. Deposition is an attractive way to make extremely fine-grain materials since the crystallites of the materials of interest may be grown and consolidated, simultaneously, at temperatures which are low relative to their fusion temperatures, or even to their sintering temperatures. These bodies made by various deposition methods, therefore, need not be limited as to their coarse crystalline habit, as in casting; or as to agglomeration, or grain growth, as in powder pressing and sintering. Properly manipulated, they can be consolidated to virtually full density, quite free of internal voids and defects.

Both electrochemical deposition (ECD) or physical vapor deposition (PVD) techniques have been used by these scientists to make such samples for their scientific investigations. In the present application, physical vapor deposition refers to any of the group of similar methods, including evaporation, reactive evaporation, sputtering, reactive sputtering, and ion-plating. Such efforts are described in papers by Menezes and Anderson; J. Electrochemical Soc. 137, 440 (1990) and Chu and Barnett; J. Appl. Phys., Vol 77, No. 9, 1 May 1995. The samples have been useful to investigate the achievable improvement in properties from materials with grain refinement smaller than 0.25 micron (<250 nanometers). Small-scale samples have been made and tested. They have usually been made of a multiplicity of thin layers. Films with crystallite sizes well below 100 nm (even below 10 nm) have been successfully synthesized. These techniques, however, approach the objects of high performance materials in a very different way from those of the invention. They did not involve the strengthening and hardening of a metal with some intrinsic toughness, but rather an investigation of what happens when the grains of an intrinsically brittle material are refined.

It has been determined that much greater hardness can be achieved in such materials by the aforementioned techniques. However, improvements in strength or toughness have not been generally measured and reported.

The chemical vapor deposition (CVD) process would be more appropriate for the manufacture of industrial parts of the materials of interest than ECD or PVD. CVD, although requiring processing temperatures higher than either ECD or PVD, can still be processed well below the required fusion temperatures or sintering temperatures for the materials of interest. In the present application chemical vapor deposition is meant to include both simple thermally-activated CVD as well as plasma-assisted CVD. Since the control of CVD is more difficult than that of either ECD or PVD, it has been used very sparingly for any kind of nanotechnology research and hardly at all for any commercial manufacture of such fine-grain materials.

There are three notable exceptions. The most significant one is described in U.S. Pat. No. 4,162,345 to Holzl ('345). Two decades ago, the inventor, Holzl (one of the co-inventors of the current invention) taught, in the '345 patent, that materials made by a then-unique variation of the CVD process could be made to demonstrate a useful combination of strength and hardness such as to provide excellent wear resistance. The material could be described as an early version of what is currently being called a nanostructure.

The second is a research program conducted at Stevens Institute of Technology by Eroglu and Gallois in which thin nanostructure TiN/TiC coatings were investigated (see "Design and Chemical Vapor Deposition of Graded TiN/TiC Coatings"; Surface and Coatings Technology 49, 275 (1991)). Like the Chu and Barnett work, cited above, these investigators took a different approach than that of the invention. They were also investigating the refinement of normally brittle materials.

The third is a wear-resistant coating for cemented carbide tools which has been offered commercially since late 1998 by Widia Valenite. That company introduced a thin, nanocrystalline coating for cutting tools made by what is called multilayer CVD (MLCVD). They report improved wear life for certain cutting applications and claim that crack formation through the entire thickness of the coating is minimized by the multilayer configuration. The reported coating is comprised of conventional, brittle, coating materials, titanium nitride and titanium carbonitride. No improvement in strength was reported, or should have been expected from this work.

The background art closest to the current invention is the referenced work of the '345 patent. Most of the microcrystallites in the Holzl material were in the order of 50-100 nm, but it contained some that were as much as ten times larger. The material was actually used for certain important valve trim in the NASA space program. Unfortunately, the method of the '345 patent could not be reproduced with acceptable reliability and was extremely expensive. The irregularity of the crystallite size was a major problem which was never adequately solved. The process was subsequently discarded as unacceptable for industrial use.

However, there is ample reason to continue to be interested in CVD as a process for making nanostructural parts. Electrochemical deposition while totally acceptable for the common metals is practically useless for making refractory materials such as tungsten, its alloys, or compounds. PVD can be used to make common metals and compounds at very high rates, but for refractory metals and alloys, deposition rates are unacceptably low. Chemical vapor deposition, on the other hand, can synthesize such refractory metals and ceramics at very acceptable commercial production rates. CVD is superior to ECD and PVD as manufacturing processes in other ways, as well. Principal among them are its excellent throwing power and its ability to make materials of higher and essentially full density, virtually free of internal voids. The use of CVD to produce high melting and chemical and wear-resistant metals and ceramics is well-known.

Processes for making free-standing shapes of the so-called refractory metals and alloys have been known for decades. For example, pure tungsten tubing has been made commercially by depositing the metal on a mandrel from which it is then removed. Parts of good purity exhibit a Vicker's hardness of about 4 GPa. Utilizing the method of Cahoon et al. (see J. B. Cahoon, W. H. Broughton, and A. R. Kutzak, *Metallurgical Transactions*, vol 2, pp. 1979-1983, 1971), which teaches that the yield stress of a material that is fully strain-hardened is approximately equal to one third the Vicker's hardness, a maximum yield stress for high purity, CVD tungsten of 1300 MPa would be predicted. This value is an upper anticipated limit as the CVD tungsten is not fully strain-hardened. In practice, maximum values of 900 MPa can be obtained and the material displays limited ductility at room temperature. The columnar growth of the CVD tungsten produces near-continuous grain boundaries, which act as a volumetric flaw within the material. This structure leads to brittle failure of the tungsten at room temperature with strengths closer to 300 MPa for larger-grained, free-standing shapes. The corresponding low fracture toughness limits their utility. Reducing grain size would be expected to increase the strength. One technique for so doing is the lowering of the deposition temperature. The process then suffers from reduced deposition rates. A second technique involves mechanical burnishing the work piece during deposition (see L. W. Roberts; Proc., Sixth Plansee Seminar, Reutte, Austria, 1967; pp 881-884). This is mechanistically difficult on all but the simplest of work pieces. The highest strengths achievable by either of these techniques is, at most, about 900 MPa. All of the strength values cited above, and those that follow in this application, are flexural strengths, measured in 3-point bending with 2-4 mm diameter round rods.

Brittle materials like the refractory carbides, nitrides, borides and suicides are also conveniently made by CVD. CVD-synthesized tungsten carbide, having a hardness above 20 GPa, is not likely to have a strength of greater than 70 MPa and is essentially useless as anything but adherent thin coatings.

CVD has been used for years to produce thin films, such as oxidation-resistant coatings for high temperature metals and wear-resultant coatings for a wide variety of cutting tools. In the case of such thin coatings as these, c.a., 4-8 μm, the deposits are not required to have significant strength since their structural integrity is derived from the substrate upon which they are adherently deposited. Thin coatings of this kind which also were extremely fine-grained are described in U.S. Pat. No. 4,427,445 to Holzl.

The process described in the '345 patent and other related patents by Holzl is the most notable claim of using CVD as a means of producing metals, semi-metals, or refractory compounds having an unique combination of high-strength and excellent fracture toughness, especially in materials of high hardness.

Following the teachings of the aforementioned Hall-Petch relationship, there was reason to believe that the characteristic of the materials described in the '345 patent which caused them to have such unique properties was their extreme grain refinement, c.a., 50-100 nm. Their high hardness was attributed, at least in part, to their content of tungsten carbides. There is also ample reason to believe that the variability which was experienced in the products made by the method of the '345 patent was due to the presence of some irregular, larger grains in the structure.

In the specification of the '345 patent, Holzl postulated that the formation of the microcrystalline grain structure was a result of a reaction off of the surface of the substrate to form a liquid intermediate product which was subsequently reacted to form a second liquid intermediate product, which is deposited on the substrate, thence, rapidly, to be reacted to form the desired solid phase. In this respect, this process might be the equivalent of very rapid quenching of a metal from the melt which has been used to cast extremely fine-grain materials. Such a sequence of events probably occurred but, was not, in and of itself, sufficient to fully explain the results.

Holzl also postulated that the observed layered structure was caused by oscillating turbulence in flow of the fog or halo off of the substrate. This is now believed, based on the investigations of this invention, to have been an absolutely essential factor in the described deposition behavior.

The near impossibility of causing this oscillation to occur in a totally predictable way was most likely the fundamental cause for the process being non-reproducible and discarded as not commercially practical. Each time that the size or shape of the deposition reactor was changed and each time that the size or configuration of the work piece(s) was changed, an entirely new set of deposition conditions needed to be determined to establish this oscillating turbulence properly.

The process was so sensitive that even minor changes in the positioning of the work pieces in the reactor could cause failure of the processing runs. The layered structure was simply not acceptably uniform in its frequency and thickness of its layers.

The material made according to the method of the '345 patent was considered to be an alternate and improved method to the powder metallurgy of cemented carbides for the making of hard metal parts for tool and wear applications. It was considered to be superior to cemented carbides because it eliminated some of their deficiencies. In many cases, the wear resistance of cemented carbides is dictated more by the performance of the cement than by the hard particles and is thereby limited. In short, wear occurs frequently by the failure of the cement allowing the hard particles to be removed from the body without the particles, themselves, actually fracturing or wearing.

This behavior of cemented carbides can be compared with that of other wear materials like tool steels. Tool steels, although they contain two or more phases, wear like a homogenous material, not like a mixture. They also have greater toughness than any other materials of equivalent hardness.

If tool steels could be made as hard as the cemented carbides, they would be much preferred. The same statement could be made about cast, hard nickel or cobalt alloys versus the cemented carbides. The maximum hardness of tool steels or the cast hard alloys, however, is typically only about one half the maximum hardness of the cemented carbides; to wit, ~7-9 GPa Vickers Hardness Number (HV) as compared to ~11-22 GPa. For this reason they are disqualified from many applications for which cemented carbides can be used. An additional advantage of the cemented carbides over tool steels is, of course, their ability to maintain their strength and hardness at the high temperatures generated within the tool material in certain machining operations.

Note that as included in this disclosure, HV is used to denote Vickers Hardness Number as measured with a 500 g or 1000 g weight on a Shimadzu Microhardness Tester, unless otherwise cited.

SUMMARY OF THE INVENTION

The current invention makes metal alloys which, in many respects, are similar to tool steels. It does not attempt to make brittle, ceramic-like materials stronger and tougher, as is done in cemented carbides, but rather to make a more ductile, metallic material stronger and harder, as is done in tool steels. The invention utilizes Group VIB transition metals, such as tungsten, molybdenum, or chromium.

In an illustrative embodiment of the current invention, tungsten is utilized as the primary material. However, it will be appreciated by those of ordinary skill in the art that other Group VIB transition metals, such as molybdenum or chromium, could also be used and still remain within the scope of the current invention. In the illustrative embodiment of the current invention, the tungsten alloy is significantly tougher than many other forms of tungsten due to the near brittle nature of tungsten at room temperature.

In comparison to tool steels, the invention makes use of materials such as tungsten as the major constituent, instead of iron. Intrinsically, tungsten is stronger than iron; this is because it is generally accepted that, for a given crystallite size, the attainable maximum yield strength varies directly as the square root of the ratios of the stiffness of any two materials. Tungsten having almost exactly twice the stiffness of iron may be expected to have an intrinsic strength of about 1.4 times that of iron. The greater stiffness of the tungsten, per se, can be important in many applications.

In addition, tungsten, and tungsten alloys, with their high melting temperatures, maintain their strength and hardness at higher temperatures than do iron or iron alloys. Although the materials of the present invention are a mixture of two species (like tool steels or cemented carbides), the crystallite size of each of the species in the invention alloys is so small that they, like the tool steels, and unlike the carbides, act like a homogeneous alloys. In the following description, they are, therefore, referred to as alloys.

Accordingly, it is an objective of the present invention to provide an improved method for producing alloys of Group VIB transition metals which have properties superior to alloys of such metals which are currently commercially available. These metal alloys are more controllable and more able to be tailored to desired properties as compared to those described in the '345 patent, and the mechanism of strengthening and toughening is different from that purported in the '345 patent. The improved method allows for totally acceptable reproducibility, is capable of being scaled up to larger quantities of product, can accommodate products of different sizes and configuration, and is inexpensive to operate.

It is an objective of the invention to be able reproducibly to make coatings and free-standing parts of such metal alloys, which would have unusual and desirable combination(s) of strength and fracture toughness for any applications in which conventional, lower performance alloys might be used and exhibit significantly greater resistance to recrystallization than alloys whose fine-grain size is derived from extensive mechanical working.

It is an objective of the invention to provide an alloy of adherent layers wherein intermediate layers prevent epitaxial growth between adjacent layers.

It is an objective of the invention to provide alloys in which both the deficiency of low strength and that of low toughness are avoided.

It is an additional objective of the invention to make alloys as coatings or as free-standing bodies, which have such unusual combination of strength, fracture toughness, and hardness that they provide longer useful life as tools or other wear parts.

It is an additional objective of the invention to make alloys as coatings or as free-standing bodies, which are able to be made directly to include, or finished to include, surfaces of great smoothness by virtue of which the bulk properties of the alloy can be achieved without suffering from failure due to surface defects, and which, in addition, have utility for reflecting or low-sliding-friction surfaces.

It is an additional objective of the invention to make alloys which are capable of being finished with very keen edges or very smooth surfaces required for many tool and wear parts.

Other objects and advantages of the present invention will become more apparent to those skilled in the art from the following description, taken in conjunction with the accompanying drawings.

DETAILED DESCRIPTION OF PREFERRED EMBODIMENTS OF THE PRESENT INVENTION

The nature of the alloys which are the subject of this invention is best revealed by the manner by which they are manufactured. An illustrative method utilizes CVD equipment of a generally accepted design, like that shown in FIG. 1.

In a first illustrative embodiment of the method, a volatile halide of tungsten is supplied as a gas from a separate container, or is generated in situ by reaction of the elements. It is clear that the volatile halide of tungsten may be chosen from the group comprised of fluorides, chlorides, bromides or iodides.

The highest valence state fluoride, $WF_6$, would be an attractive choice. It is readily available commercially, is conveniently packaged, and has sufficiently high vapor pressure to allow its easy dispensing into a CVD system. In fact, it is the most commonly used precursor for tungsten deposition by CVD. Unfortunately, because of modern considerations of environmental hazards, fluorine and any volatile fluorides are now very expensive; for example, $WF_6$ is so expensive as to virtually disqualify it for most industrial uses except for premium applications such as microprocessors and the like.

Tungsten chlorides, on the other hand, are inexpensive, have acceptable chemical thermodynamic characteristics and present minimal environmental problems in the deposition process, per se, or in any recycle or waste disposal processes indicated. There are three sufficiently volatile tungsten chlorides: $WCl_6$, $WCl_5$, and $WCl_4$.

The tungsten bromides and iodides are clearly acceptable precursors for the deposition process, but appear to offer no advantages over the chlorides and are more expensive. While this is also true for molybdenum, a volatile iodide is the most effective precursor for the deposition of chromium.

The tungsten halide may be dispensed from an external container, using heated lines and an inert carrier gas, if required, to assist in the transport. Such heating and carrier gas are not required for very volatile tungsten hexafluoride. They are for the more commercially desirable tungsten chloride precursor, however.

Figure 1:
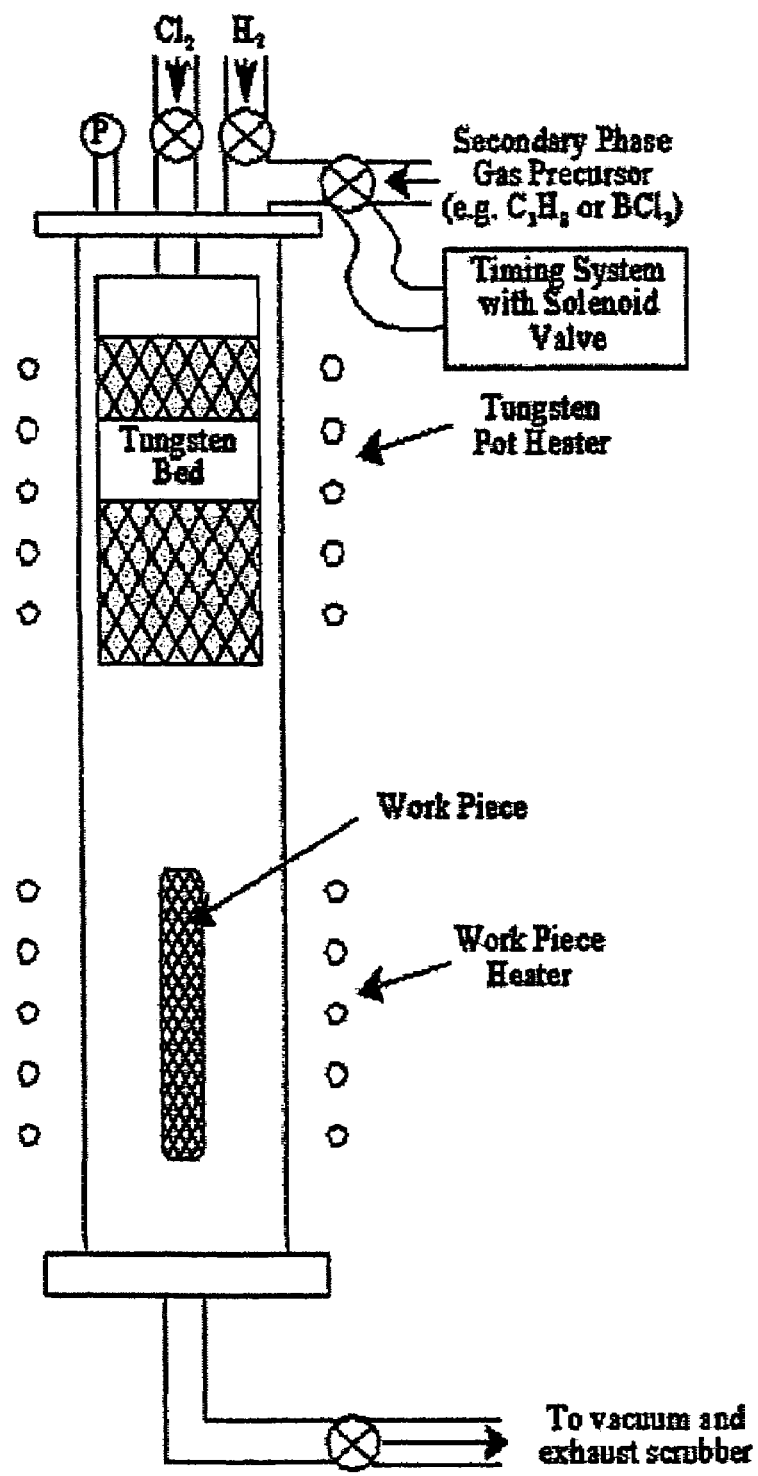
FIG. 1 is a schematic drawing of a type of CVD equipment used for the invention.

FIG. 1 shows the more convenient technique of making the tungsten chloride in situ. Chlorine gas is metered through a heated bed of tungsten chips where it combines to form the necessary tungsten chloride to transport the tungsten. Different kinds of chips may be used. The term chips is used to distinguish the feed material from powder or large chunks of metal, both of which are not satisfactory. The powder has the necessary large surface area but can pack too tightly, thereby not allowing the gas to pass uniformly through the bed. It is also likely to be entrained by the flowing gas. Large chunks have too little surface area.

Tungsten scrap can be very useful. Machining turnings or chopped wire are inexpensive and in good supply. Virgin powder can be pelletized and made to work successfully.

Bed temperatures of between 600-900° C. are required; depending on the total surface area of the chips used and the flows of chlorine. Lower temperatures are suitable for the low flows which would be used for the low deposition rates such as in making thin coatings, but do not provide for sufficiently rapid reaction with commercially-required flows for massive coatings or free-standing bodies. Excessively high temperatures tend to drive the product to a non-volatile lower chloride.

Using this technique eliminates the necessity for using heated feed lines or a carrier gas or both, and minimizes the corrosion and contamination problems of such a heated system.

To make a chemical vapor deposit of tungsten metal, the chloride flows from the bottom of the chip bed into the reaction zone of a gas-tight vessel where it is made to encounter heated workpiece substrates. The temperature to which the workpiece substrates are heated depends on which tungsten halide is used and the quantity of hydrogen used as a reductant. In the absence of hydrogen, a deposition temperature above 1200° C., would be required. With a hydrogen reductant and a tungsten chloride precursor, the temperature is selected to be between about 400° C. and 1100° C.

The workpiece can be heated by any of the standard techniques used for conventional CVD, such as the use of an internal heater, radiation from a hot wall or by induction. Lower temperatures are used for a low deposition rate, as, for example, in the formation of thin coatings. In contrast, high temperatures are used for high deposition rates as are required for commercial acceptability in the making of massive coatings or free-standing parts.

The volatile metal halide is decomposed by heat and the action of the reducing gas to form the desired deposit on the workpiece. Hydrogen, as shown in FIG. 1, may be utilized as a reducing agent.

The continuous flow of reactant products is continuously removed from the reaction zone by a vacuum pump, designed to allow operation at sub-atmospheric pressures to control the deposition rate and the crystallite size, and to minimize any condensation or desublimation of any of the reactant or product gases. As noted above, the temperature of the workpiece also is used to control the deposition rate.

Conventional CVD of tungsten and of compounds of tungsten are quite straightforward. In the method of the invention, the deposit is not made by a conventional CVD process, however. It does, however, produce the near theoretical density and freedom from large flaws that are characteristic of CVD.

The process is started by the deposition of a very thin tungsten film on the substrate. The tungsten film of the invention is typically about ten to 1000 nm thick. The very thinness of the film additionally assures freedom from large flaws in the deposit. Such internal flaws are avoided by eliminating both porosity and large grain boundaries. For purposes of the following discussion the tungsten film is called a primary film.

After the extremely short duration of deposition required to produce a thin primary film (usually only a few seconds), an additional gas is conducted into the reaction zone so as to cause formation of a thin film of a compound of tungsten, e.g., a carbide, boride, or silicide. This additional gas is shown in FIG. 1 being injected with the hydrogen, but it may be injected at any point upstream of the workpiece(s). The additional gas is injected in short pulses, controlled by the timer valve shown in FIG. 1. For purposes of this description, this film will be called a secondary film.

The CVD process, as regularly practiced, produces first deposits made on an indifferent substrate that are extremely fine-grained, unoriented, and, slower growing. After a period of time, however, the growth becomes oriented and faster.

In a method of the invention, the growth of each primary microcrystalline film is stopped, therefore, by the secondary microcrystalline film, before the coarser, oriented, crystallites begin their growth. The material of the secondary film must be of sufficiently different crystal habit from the body-centered cubic habit of the primary film metal and of sufficient thickness as to interrupt this oriented, rapid growth of the crystallites of the primary film. The secondary film must also be inactive with the primary film. In other words, the primary and secondary films must not readily react chemically with each other nor significantly dissolve in each other. The avoidance of this rapid growth of the crystallites of the primary film is necessary to prevent coarsening of these crystallites from their initial, very-fine habit and to control the thickness of any primary film as necessary to effect the method of the invention.

Figure 2:
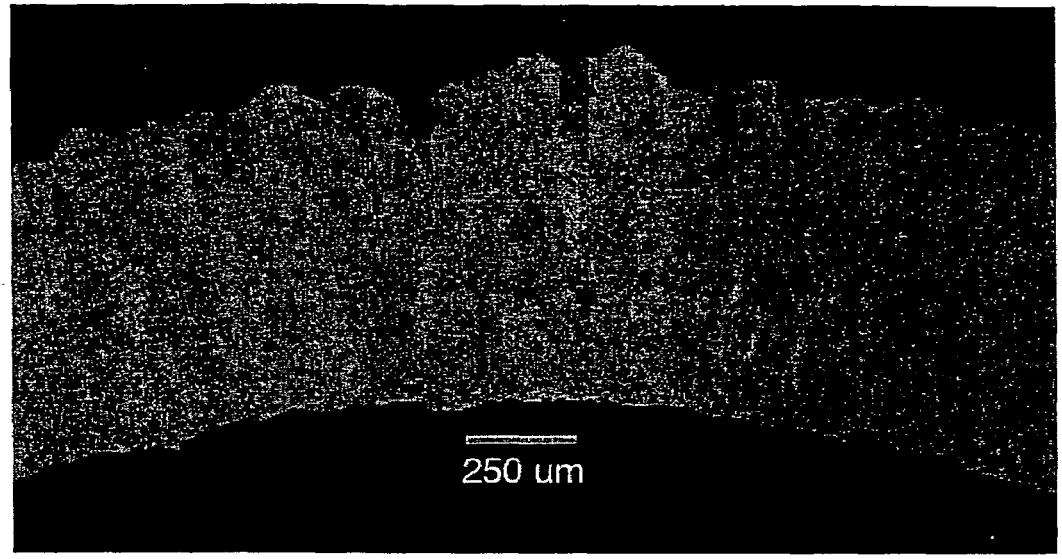
FIG. 2 is a low magnification photomicrograph of a conventional tungsten chemical vapor deposit, showing coarse columnar grains. It is the intergranular cracking between these large grains that causes the weakness and poor toughness of such metals. It was necessary to use a low magnification to illustrate the structure because of the coarse grains.

FIG. 2 shows how the crystallites continue to grow in a columnar habit if they are not interrupted. This is shown at a low magnification because the crystallites are so large.

Figure 3:
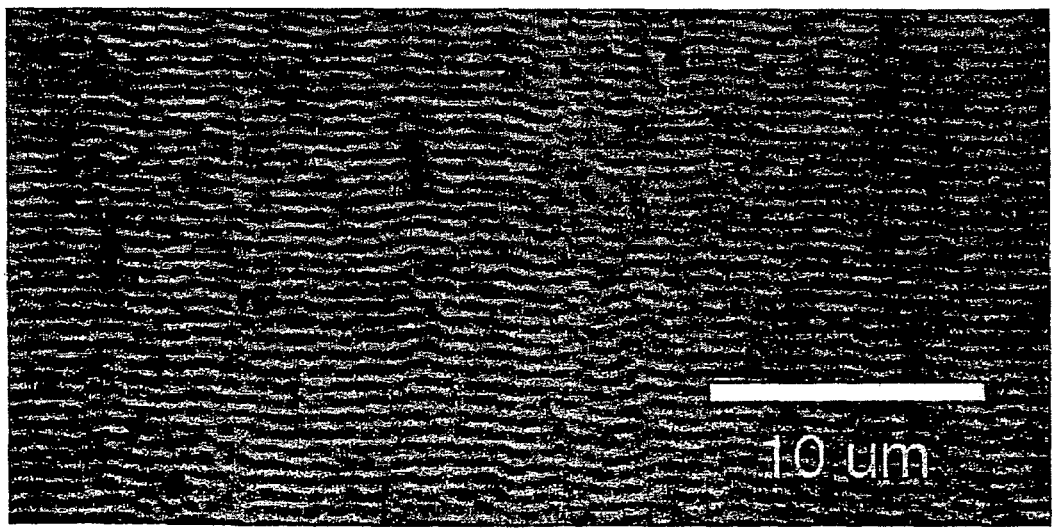
FIG. 3 is a medium magnification photomicrograph showing the uniformity of the primary and secondary film structure made possible by this invention. Higher magnification had to be used in this figure because of the very fine grains.
Figure 4:
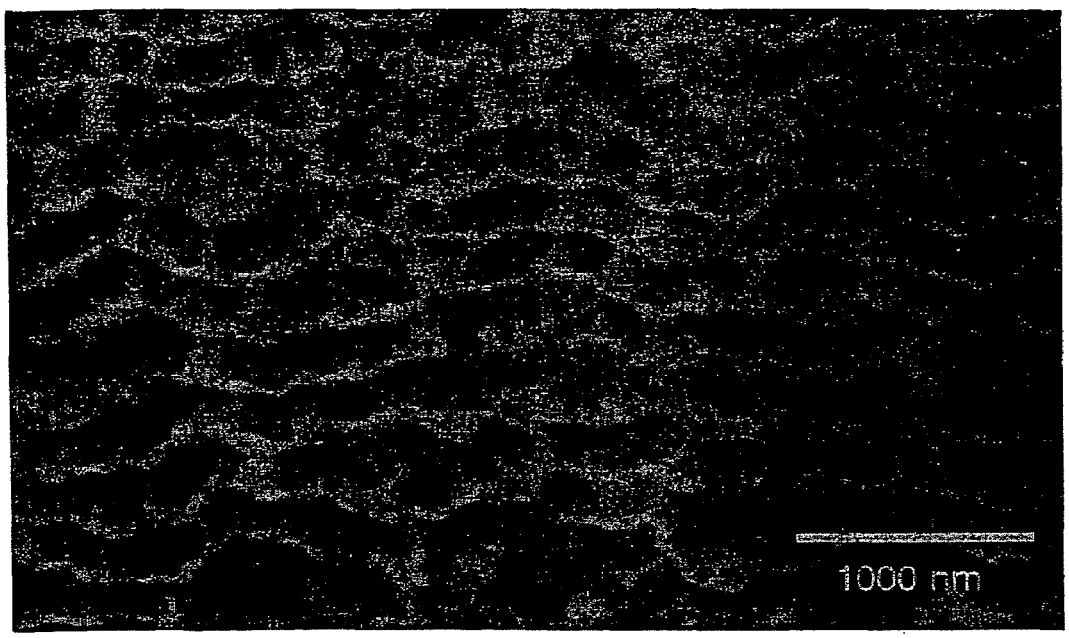
FIG. 4 is a higher magnification photomicrograph of a fine-grained, tungsten alloy of the invention. Note that the grain sizes are in the range of 150-200 nm, about in the middle of the range of typical grain sizes for the alloys of the invention.

FIGS. 3 and 4 show how the secondary film effectively interrupts this columnar growth and maintains grain refinement on a nanocrystalline scale. These are shown at a much higher magnification.

A secondary film must also be very thin. This is because, first, its rapid growth and coarsening must also be prevented, and second, control of its thickness is a crucial part of the invention. Its thinness avoids the formation of flaws in the secondary film, itself. It can be seen that one of the unique aspects of the invention, as compared with conventional CVD, is the high-speed, controlled switching of the precursor gases.

In the illustrative embodiment, the secondary film is comprised of tungsten combined chemically with a another element to form a compound of tungsten. In this embodiment, carbon and boron are the preferred elements. They have been determined to be acceptable in combining with tungsten to form secondary films which effectively perform the function of arresting the growth of the primary film crystallites. The word form is used in the preceding sentence since it is intended to refer either to making the compound of tungsten by some conversion of the previously-deposited primary tungsten film or totally by deposit from the gaseous species. The words form and deposit are used interchangeably throughout this application to describe the making of the secondary films.

In the making of the material of the '345 patent, it was thought to be important that the second phase be a hard material. The high hardness of some of the embodiments of the alloys of the invention is believed to be dominated by the grain refinement, however. Although high hardness of the secondary films can clearly contribute to the hardness of the overall material, secondary films of lower hardness can clearly make useful alloys. It would be obvious, however, to someone of skill in the art that whereas the material of the secondary films need not be hard to effect the necessary function of stopping the growth of the primary grains and preventing epitaxy, there would be advantage in its being hard. These compounds comprising the secondary film in this embodiment can properly be called hard metal compounds. In this description of the invention we are following the definition of hard metals presented in the well-known text, Refractory Hard Metals; P. Swartzkopf and R. Keiffer; The MacMillan Co., New York, 1953; Chapter 1.

The crystal structure of the secondary film composition does not appear to be of profound importance. For example, there are three reported carbides of tungsten. The uncommon $W_3C$ is formed only at relatively low deposition temperatures; below about 600° C. It can be expected to be a useful secondary film for thin coatings deposited below that temperature. At higher deposition temperatures; as in the deposition of massive coatings or free-standing bodies, both WC and $W_2C$ have been observed. For example, when propane is used as the precursor for the secondary film, the composition has been determined, by x-ray diffraction to be W2C. On the other hand, when propylene, which has a higher carbon activity, was used as a precursor, the composition of the secondary layer was determined to be WC. Either seems effective in interrupting epitaxial growth of primary film crystallites. The two carbides are of similar hardness and appear to have a similar slope in the Hall-Petch relationship.

In the case of the tungsten borides, three compounds, $W_2B$, WB, and $W_2B_5$, are known to exist. Available thermochemical data would suggest that the last would be unlikely to be made with any convenient deposition conditions. The behavior of $W_2B$ and WB are expected to be the same as the carbides as far as behavior as secondary films is concerned. A tungsten boride secondary film has been demonstrated, experimentally, to be effective in interrupting the epitaxial growth of tungsten. However, the crystal structure could not be identified by x-ray diffraction due to the small fraction of boride present in the alloy.

The disilicide of tungsten would appear, from thermochemical data to be the only silicide of consideration as a secondary film.

There are specific reasons for having the secondary film contain a tungsten compound. The reasons for this selection are discussed below.

When the secondary film is being formed, the flow of the tungsten-halide-containing primary film precursor gases is not turned off. The reactants for the secondary films are simply added to the former. Suitable additive reactant gases for a carbide, boride, or silicide secondary film are, for example, a volatile hydrocarbon or a gas like carbon monoxide for a tungsten carbide secondary layer, or a volatile boron halide for a tungsten boride, or a volatile halide or hydride of silicon.

Many more compositions for the secondary film are possible: other compounds of the primary metal, even including intermetallics, other metals, semi-metals, other metal compounds, or semi-metal compounds. There are two considerations when using these other compositions as the secondary film. The first would be to assure that abrupt heterojunctions are effected between the primary and secondary films. This means that any species used to make the secondary film preferably has limited reactivity with, or limited solubility in, the primary film metal at the consolidation and use temperatures of the alloy, as is the case with the primary metal carbides, borides, and silicides.

There is also the matter of the possible necessity that turning off the flow of the primary-film deposition precursor might be required. It certainly would be possible to make the secondary films from other compounds of the primary metal, even including intermetallics. However, to make the film of a different metal or of a semi-metal compound could, in most cases, require switching of the primary precursor. An exception to this switching requirement for a semi-metal compound secondary film might be silicon carbide since it can be formed by decomposing a single gas in the presence of the precursor gases for the primary films.

This switching of the primary film precursor is considered to be less convenient from a commercial point of view. In order to insure that none of the primary precursor remained in the deposition chamber, an additional inert gas purge cycle might need to be included between each thin film deposition, which would greatly increase, perhaps even double, the overall processing time for a deposition run. In any event, a process for depositing an alternative secondary film which involves switching between precursor gases is within the scope of the present invention.

Such a process for depositing an alternate type secondary film could include the following steps: (1) Turning on the primary deposition precursor and allowing it to flow for a selected deposition time; (2) Turning off the primary precursor; (3) Turning on an inert gas for a time sufficient to purge all of the former gas out of the chamber; (4) Turning on a secondary film deposition precursor(s) and allowing it to flow for a selected deposition time; (5) Turning on an inert gas for a time sufficient to purge all of the former gas out of the chamber; and (6) Repeating the cycle until a sufficient deposition thickness is attained.

Returning to the first illustrative embodiment of the process or the present invention, the important selection criteria for the composition of the secondary films are:

1) that only a single additive gas be needed;
2) that this: single gas can be made to react with the tungsten precursor gas(es) to form the solid secondary film at conditions essentially identical to those used to deposit the tungsten in the primary film, and is not so unstable as to react homogeneously in the gas stream to form soot (finally divided, entrained particulate);
3) that the gas be easily supplied to the system and easily and rapidly turned on and off;

4) that it make a secondary film that will not react with the primary film at processing or anticipated use temperatures; and 5) that it provide an effective barrier to the epitaxial growth of the tungsten crystallites from one primary film to the next primary film.

The use of a carbon or boron-containing reactant gases for the additive gas to produce the secondary films satisfies the above requirements. Other compositions for secondary films, such as compositions containing oxygen, are also within the scope of the invention. From an engineering point-of-view, this simple addition of another gas to form the secondary film makes this required gas flow switching to form the very thin layers reasonably simple. It would be much more complicated and create significant flow disruption, if the primary film precursor gas would also have to be switched.

In an alternate embodiment, a different kind of precursor can be used for the secondary film deposition. For example, silicon carbide might be a useful composition for the secondary film. It is a hard material, making it useful for tool and wear applications for the alloys of the invention. It has a very acceptable match in coefficient of thermal expansion with tungsten or molybdenum. It should be effective in interrupting the epitaxial growth of the primary film grains; and, it would appear to be possible to inject precursor gases for it without the need of switching off the flow of the primary film precursor gas. In addition, it should be acceptably inert to the primary film metals at both the processing and contemplated use temperatures.

As noted above, the control of the thickness of the secondary film is important. Referring again to the first illustrative embodiment, after the selected duration for the flow of the additional gas and the achievement of the desired thickness of the secondary layer, the additional gas is turned off. This duration of flow for the gas of the secondary films is shorter than that for the primary films for most useful product applications. For very hard coatings or very hard free-standing bodies, the secondary films may be as thick as, or even thicker than, the primary films.

There would appear to be a minimum thickness for the secondary film. An estimate of this thickness can be made, as follows: The atomic diameter of tungsten is about 0.3 nm. A grain boundary is necessary to interrupt the epitaxial growth of the primary film grains. It is taught in the widely accepted text, Dieter, George E., "Mechanical Metallurgy" from the $3^{rd}$ Ed., M$^c$Graw Hill, 1986; that grain boundaries are "a region of disturbed lattice only a few atomic diameters wide". This would indicate that it would require a secondary film thickness in the order of 1 nm. to effect the necessary interruption.

Even if thickness of the secondary films is greater than that of the primary films, the secondary films must be very thin to eliminate the possibility of large flaws in this material of little of no ductility. This obviously implies that, if the secondary films are to be thicker than the primary films, the primary films must be exceeding thin.

The ratios of these thicknesses are used to control the desired hardness of the alloy in addition to the hardness enhancement due to the extreme grain refinement.

After a secondary film is formed, the tungsten halide continues to flow, being decomposed to form another primary (tungsten) layer, after which the additional gas is admitted, again, to form an additional secondary layer and to interrupt growth of the tungsten crystallites again. The process may be repeated forming a multiplicity of very thin films, which are highly adherent one to the other, until the desired thickness of the coating or body is attained.

By using this gas-switching technique, microcrystalline material of great constituency and high repeatability is able to be accomplished, as shown in FIGS. 3 and 4. Whichever technique of the present invention is used, the thickness of each of the primary films can be maintained within a 2:1 ratio of any other primary film and the thickness of each of the secondary films can be maintained within a 2:1 ratio of any other secondary film. When using the gas-switching technique, the actuation speed of the switches should be as rapid as possible, as, for example, by the highest-speed-available, solenoid-actuated valves to assure the growth of abrupt heterojunctions.

In addition to serving simply to interrupt the growth of the crystallites of the primary film, the secondary films must be of sufficient thickness to prevent the continuation of the epitaxial growth of the primary film crystallites in the next primary film, i.e., to prevent the continuation of the epitaxy across the secondary film. In the research of Chu and Barnett, referenced above, such interruption is not effected and a totally different mechanism of ensuring the nanostructure behavior is employed. In the method of the present invention, physical vapor deposition could also be effectively used for both the primary film and the secondary film. The required thickness for prevention of the continuation of epitaxy depends on the difference in the crystal dimensions and type of the crystallites in the secondary film as compared to those in the primary film.

As noted above, however, whereas the secondary film must be sufficiently thick to interrupt the epitaxy of the primary film crystallites, it cannot be too thick. In one embodiment, the secondary film is thinner than the primary film. In an alternate embodiment, the secondary film may be thicker than the primary film but less than approximately 400 nm. For the invention to be most effective in creating the unusual physical properties in the products made therefrom, the secondary film should not exceed a certain thickness. This thickness is approximately equal to or less than the critical size of defects which would degrade the fracture toughness of the bodies.

The unique crystal habit has additional advantages:

a. the alloys are more resistant to recrystallization than structures of tungsten in which the grain refinement is effected by mechanical working, and, b. when recrystallization does occur a fine dispersion of tungsten and tungsten carbide results that maintains much of the high strength characteristic of the alloy prior to heat treatment.

It should be clear to one skilled in the art that, in an illustrative embodiment, the tungsten layer might be formed from a mixture of metal halides to form a solid solution tungsten alloy suitable for the primary layer.

Alternatively, a small amount of carbon or boron could be added to the primary layers; not enough to form a compound like tungsten carbide or tungsten boride, but enough to effect some solid solution strengthening. Such solid solution alloys will tend to improve both the room temperature and high temperature strength and hardness of the alloys.

A number of useful alloys of tungsten with other refractory metals are known. Such alloy additions are not necessary, however. Good properties can be attained using pure Group VIB metals, such as tungsten, for the primary films in the method of the invention. The Group VIB metals are high-melting. This makes the alloys useful for applications involving high use temperatures or for tool and wear applications wherein heat is generated. It follows, therefore, that, for most useful applications, the material of the secondary film should also be high melting.

Each of the primary and secondary layers is, as noted, a quite thin, microcrystalline layer. Useful dimensions are on the order of 10-1000 nm for the primary layer, and <1-400 nm for the secondary layer. For example, 10 nm for the primary layer can be accomplished by running the precursor gas for that layer for approximately 0.5 seconds. The deposition of a secondary layer having a thickness of less than 1 nm would require running the additive gas for less than 0.1 seconds. There is no intrinsic limitation to the total thickness of the deposited alloy, either for a coating or free-standing body. Overall deposition rates can be as high as 0.1 to 1.0 mm per hour. Massive deposits simply require extended run durations. Acceptable deposition rates for thin coatings can be much lower.

In one embodiment, the invention is primarily directed toward the production of thick coatings or free-standing parts. Either of these are parts where external finishing of the deposited material is usually indicated. It should be explained that from a deposition point-of-view there is really no difference between a massive coating (e.g., one of about 0.1 mm to several mm in thickness) and a free-standing part. The only difference is that in the case of the massive coating the deposit is made to be adherent to the substrate and is left on the substrate; whereas, in the case of the free-standing part it is removed from the substrate, either mechanically, by contaminating the substrate surface and thereby assuring that it is not adherent, or by liquid dissolution of an inexpensive substrate/mandrel, or even by reacting the mandrel with an active gas to completely remove it and form the free-standing part. Whether it be a massive coating or a free standing part, the properties of the deposit largely determine the bulk performance of the finished part.

Even thin coatings of the material of the invention, on the order of 4-8 µm, although they do not need the improved mechanical integrity of the improved material of the invention, will, under certain circumstances, have their performance enhanced by the superior properties of strength and toughness and hardness.

A method of the invention allows the synthesis of tungsten alloys covering a wide range of selected compositions from alloys of very near pure tungsten designed to have very high strength and toughness with modest hardness, e.g., an HV of 7 GPa, at one extreme (essentially providing superior properties for use in applications where conventional pure tungsten would be used) to alloys of much greater hardness, e.g., an HV of 20 GPa or more, having lesser but still relatively high strength and superior toughness over materials of equivalent hardness and good wear resistance. The properties are dependent on the size of the crystallites (which is essentially determined by the primary film thickness) and the relative amounts of the primary and secondary layers.

The primary film is sufficiently thin to control its crystallites to a sufficiently small size to provide a high yield strength in accordance with Hall-Petch. On the other hand, the primary film may be sufficiently thick to provide the necessary plasticity in the body.

The secondary film is sufficiently thick to prevent epitaxial growth of the crystallites of a preceding primary film across the secondary film into the following primary film. It is important to note that other investigators have not become aware of the importance of this requirement. The secondary film is sufficiently thin to prevent the incorporation of flaws of critical size within the film. Both the size of the grains and the ratio of the thicknesses of the primary to secondary film provides control of the hardness of the alloy.

Regardless of how excellent the bulk properties of the invention material are, the overall behavior can be further improved by addressing the surface behavior. Simplistically, it can be stated that to achieve the maximum performance from the invention material, the surface is sufficiently free of flaws so that the body does not fail by surface defects at a stress level less than it would survive based on its bulk properties.

There is nothing unique about a discovery that the strength of materials is improved by eliminating surface flaws. With the grain refinement which is to be found in conventional materials, the bulk properties are seldom good enough so that the performance of a body can be limited by the superficial properties. What has been discovered in this invention, though, is that when a body is made of a multiplicity of very thin films by CVD in such a way that epitaxial growth is eliminated, the entire body is virtually totally free of strength limiting defects. When this occurs, the crack initiation stress is raised greatly, but the critical flaw length is reduced greatly and approaches the size of the very small crystallites.

This means that such materials are potentially very strong, but that this strength is more effectively realized if the surface finish is very good. Cahoon's metric of $\sigma_{ys}$~⅓ HV is observed to be strictly followed for the subject invention at HV of 13 GPa if the surface finish is nearly perfect, i.e., of a roughness of not much greater, if greater at all, than the grain size of the crystallites in the body (for practical purposes, the size of the grains in the primary film). Non-trivial plastic deformation for a material of such high hardness is also observed. It is believed that higher ultimate strengths as well as plastic deformation would also be observed in materials with hardness even greater than 13 GPa if the surface defects were to be reduced to close to or less than the grain size of the primary film, i.e., ~100 or 200 nm. Such good finishes can be achieved by grinding with a very fine-grit wheel; but they have been more easily achieved, with less danger of causing surface flaws, by electro-polishing. Similar finishing methods like electrochemical grinding or chemical mechanical finishing, should be as effective as electro-polishing.

It should be noted that tungsten was selected for the investigations in connection with which an illustrative embodiment of the invention was made because of its high theoretical properties of strength, stiffness, and strong bonding as compared with other metallic materials.

Originally it was the intent of these investigations to make a hard metal composition from a mixture of tungsten carbide to provide the hardness and a sufficient amount of pure tungsten metal to provide sufficient strength and toughness. To be competitive with commercial cemented tungsten carbide products, the hardness could be selected in the range from about an HV of 12 GPa to about 22.

Based on the well-accepted Rule of Mixtures and the known hardness of W and WC, this would indicate a composition between about 40% WC/60% W and about 90% WC/10% W. Of course, some hardness enhancement would be expected due to extreme grain refinement so that the need for such high concentrations of WC was not really anticipated.

The current invention involves a desirable low fraction of a brittle hard metal compound and a resulting high fraction of nominally pure, softer metal. For even the hardest alloys of the invention the total volume of hard tungsten compounds (in the secondary films) does not approach 100%. At as little as 5% of carbide or boride, it might be expected, based on the Rule of Mixtures, that these hard species would make the alloy mixture having an HV of about 5 GPa. In fact, when the primary grains are refined sufficiently alloys of over 20 GPa result. 20 GPa is as hard as cemented carbide tool materials. It is apparent to those of ordinary skill that much hardness enhancement has been accomplished from grain refinement in alloys per Hall-Petch. However, the inventors are not aware of its having been accomplished before. Using the method of the invention, very consistent enhancement of both strength and hardness is achieved without loss of toughness in these alloys which have an unusually high concentration of metal (with an unusually small amount of a hard brittle phase).

The composition of the secondary film also has some influence on the hardness of the alloy, particularly in those alloys having a high ratio of secondary film thickness to primary film thickness. The method of the invention assures each individual primary film can be of the same thickness as any other. Likewise, it allows each individual secondary film the same as any other in the deposit.

In contrast, the method of the '345 patent did not allow for such necessary control. In fact, this lack of ability to effect precise control of the layer thicknesses is the probable cause of the poor reproducibility of this former method.

The method of the present invention also allows these primary and secondary films to be controlled to very small thickness dimensions, even into the nanometer range. Very high strengths, which not been reported by other nanotechnology investigators, have been achieved.

These increases in hardness may be effected simply by reducing the thickness of the primary films while maintaining the secondary films at the minimum required for their epitaxial growth interruption function, or by altering both the ratio of primary to secondary and also effecting an increase in the thickness of the secondary film. The utility of either of these two methods may be determined experimentally for any given product application.

It should be apparent to those skilled in the art that there can be an advantage in programming a purposeful change in the layer thicknesses through the thickness of the deposit. This would allow, for example, one surface of a free-standing body to be very hard, and wear-resistant, and the other surface to be very tough and resistant to crack initiation and structural failure. The method of the invention allows for precise control of primary and secondary film layers of controlled varying thicknesses, or control of the ratios of primary to secondary film thicknesses to effect such a purposeful change.

Tungsten, of course, is a metal of great stiffness, about 400,000 GPa. This turns out to be important as far as the strength of the material of the invention.

The matter of the importance of the size of internal or surface flaws in this nanostructural material was discussed above.

It is generally accepted, based on the early work of Griffith, that for a given internal or external flaw (crack) the brittle fracture stress varies as the square root of the Young's modulus.

That the method of the invention truly minimizes the size of the flaws is very important, but, in addition, tungsten is a preferred common material upon which the material of the invention can be based.

There is another reason why tungsten is a preferred major species for the alloy of the invention. As taught by dislocation theory, microcracks nucleated at the head of a dislocation pile-up subjected to a shear stress, can cause brittle fracture if the applied stress can propagate the microcrack. This failure stress is inversely proportional to the square root of the microcrack flaw size and directly proportional to the shear modulus. Therefore a material like tungsten with a higher Young's modulus (shear modulus is directly proportional to Young's modulus) is to be preferred among the common metals from both a Griffith flaw viewpoint as well as from dislocation theory. In addition, the body centered cubic crystal structure of tungsten, like iron, demonstrates the highest Hall-Petch sensitivity; i.e. a reduction in grain size results in a greater strength and hardness increase than with other crystalline forms. It is believed that other Group VIB transition metals, such as molybdenum and chromium, will exhibit similar characteristics and are also within the scope of the present invention.

These effects have been verified experimentally. We have clearly established that the flexural strength of the alloy exceeds that of commercially available alloys which are in the range of 1800 MPa. Flexural strengths of over 5100 MPa have been achieved. Such strengths have been attained even for materials with hardness in the useful range of some quite hard cemented carbide grades, c.a., HV of >20 GPa Significantly higher strengths are anticipated to be demonstrated in further development, achieving a higher percentage of the calculated theoretical maximum for tungsten of over 40,000 MPa.

In addition to flexural strengths, there are other properties of the invention which are important. A comparison of the resilience and toughness of the alloys of the invention versus other materials and, particularly hard alloys, reveals some important data.

Again, according to Dieter, Ibid.:

The ability of a material to absorb energy when deformed elastically and to return it when unloaded is called "resilience". This is usually measured by the modulus of resilience, which is the strain energy per unit volume required to stress the material from zero stress to the yield stress.

Also from Dieter:

The toughness of a material is its ability to absorb energy in the plastic range . . . . Toughness is a commonly used concept which is difficult to pin down and define. One way of looking at toughness is to consider that it is the total area under the stress/strain curve.

It can be seen that for hard, strong materials whose yield strength is very close to its ultimate strength, like the cemented carbides, there is very little difference between Modulus of Resilience and Toughness and values in consistent units would be practically identical. Such is not the case with more ductile materials like the tool steels. In fact, the following comments on tool steels can be found in the "Metals Handbook" 1948 Edition, published by the American Society for Metals:

In tool steels, the concept of toughness is best expressed as the ability to resist breaking rather than the ability to deform plastically before breaking, since most tools must be rigid articles that do not deform in service.

Additionally to the point, some values for the Modulus of Resilience, $U^R$, and Toughness are shown below (determined using flexural strength in 3-point bending):

| Material | Modulus of Resilience Joules/m$^3$ | Fracture Energy Joules/m$^3$ |
|---|---|---|
| Commercial tungsten (as worked, unrecrystallized) | $8.2 \times 10^6$ | $14.8 \times 10^6$ |
| Modern, High-Strength, Micro-grain, Cemented Carbide (~20 GPa, HV) | $10.9 \times 10^6$ | $\approx 10.9 \times 10^6$ |
| Tough Alloy of Invention (7.8 GPa HV) | $10.6 \times 10^6$ | $32.8 \times 10^6$ |
| Hard Alloy of Invention (20 GPa HV) | $24.2 \times 10^6$ | $\approx 24.2 \times 10^6$ |

The "tough alloy" is more like a tool steel, having hardness like that of such steel. It has a high toughness as compared to the most modern carbides with about the same Modulus of Resilience. The "hard alloy" (about the same hardness as the cemented carbide) has both higher resilience and toughness than the carbide.

It has been determined that the alloys of the invention have another desirable property unrelated to the above. Surprisingly, even though recrystallization is observed after a one hour exposure at 1500° C., the resulting fine dispersion of tungsten and tungsten carbide maintains a large fraction of the strength of the original alloy. The tough alloy could be used commercially in place of wrought tungsten, tungsten heavy alloys, and CVD based tungsten tubing and other fabricated shapes. The improved properties of strength and toughness can result in more robust, higher-performing products.

The high-strength, hard alloys of the present invention could be used commercially in place of tool steels, cast hard nickel or cobalt-based alloys or cemented carbides. They could be used for machining metals and nonmetallics. Furthermore, with the achievable very smooth surfaces, very keen cutting edges can be made. They can also be used for wear parts for machinery such as bearings and seals, and for wear-resistant nozzles such as those used in metal and nonmetallic cutting and finishing. They could be particularly adaptable to a wide variety of mining tools such as those used in coal mining, hard rock mining and the drilling of oil wells. Some of the best applications could be found in valve trim, particularly those involving both corrosion and erosion and in the lining of cylinders and rotary pumps.

To assist in an understanding of the invention, certain examples of techniques and products are given.

Due to the very small scale of each individual primary and secondary film thickness, direct measurement requires careful polishing and etching of metallurgical cross-sections and the use of very high magnification (20,000×-100,000×), such as obtainable with a high resolution scanning electron microscope or a transmission electron microscope, to directly observe the film thicknesses. To minimize the time and expense of such measurements relating to this invention, a useful indirect measurement of film thickness was adopted and termed "couplet thickness". This measurement can be defined as the total thickness of one primary film and one secondary film. Couplet thickness was calculated as follows:

$$d = D*(\theta_p + \theta_s)/\theta_T$$

where d is the couplet thickness, D the total deposit thickness (as measured after the run), $\theta_p$, $\theta_s$, and $\theta_T$ are the duration of a primary film deposit, the duration of a secondary film deposit, and total run duration, respectively This parameter tracked the true combined thicknesses of a single primary and a single secondary film, if, of course, as was the objective of the research, all primary films were of the same thickness and all secondary films were of the same thickness. Direct measurement at high magnification of etched metallographic specimens revealed that this consistency was fairly regularly experienced; except at the very beginning of all runs using a hot wall reactor, where a period of time was necessary before a stable heat balance among the hot-wall heat source, the reactant gases, and the work piece was achieved. In production equipment, such an unstable period can be avoided by one skilled in the art through a simple programming of the furnace energy input. The issue can be even more easily ameliorated if a reactor using internal or induction heating of the workpieces is used. This same kind of programming is one of the ways a purposeful variation of the hardness, strength, and toughness properties can be effected if such is required for certain tool and wear applications.

The ratio of the thickness of primary film and that of the secondary film in the couplet was determined in one of two ways. In the first, the deposition rates for the primary film deposits and the secondary film deposits were measured directly from previous calibration runs utilizing the same gas switching timing for either the metal or metal compound cycle, which allows the other film thickness to be indirectly calculated. Additionally the primary film thickness can fairly accurately be determined when it is known that the secondary film thickness is fairly small in comparison. Using these data, it was possible to dead reckon the metal and metal compound fraction of the couplet.

The second used the alloy composition data of the metal compound fraction in the metal as defined by x-ray diffraction. Knowing the fractional relation, it was possible to determine the primary and secondary film thicknesses of the couplet by incorporating the density of the component materials. Glow discharge mass spectroscopy data can result in a more accurate indirect determination of the primary and secondary film thicknesses if the composition of the metal compound is known (e.g. WC or $W_2C$ as determined previously by x-ray diffraction). Alternatively the same answers can indirectly be obtained more quickly and simply by determining the density by Archimedes method.

For all of the following Examples (Except for a different part temperature in Example 1), the following were held constant. Deposition substrates were made of 1 mm diameter molybdenum wire, 16 cm. long. The wire was racked vertically in a uniform array. Number of samples was either 4 or 6. Tungsten chloride was made in situ by passing metered chlorine gas over a bed of tungsten chips, heated to 800° C. Representative atom ratio, Cl/W, of the effluent gas was 4.0. All propane flow additions were at a C/W ratio of 2. Ratios for secondary films using other precursors are indicated. All runs included a hydrogen reductant in excess of the stoichiometric ratios to chlorine. Reactor deposition temperature was 900°. These are referred to below as "standard conditions".

EXAMPLE 1

Samples of tungsten were made by well-known, conventional, CVD processing methods. Conditions were as above, except that the part temperature was held at 800° C. to attempt to prevent undue coarsening of the deposits. Tungsten fabricated at higher temperatures possessed poorer mechanical properties due to their coarse nature. Resultant specimens were examined microscopically and the epitaxial growth of the tungsten crystallites shown. The sample demonstrated a strength of 810 MPa and a fracture toughness of $1.95 \times 10^6$ Joules/$m^3$. Since there was no measurable plastic deformation, the indicated specific resilience was also $1.95 \times 10^6$ Joules/$m^3$. An additional sample was electro-polished and tested. This showed a strength of 938 MPa. These were very acceptable strengths as compared with typical reported data from CVD parts, or tungsten parts made by other means of consolidation. These tests served as a base line against which to compare the materials of the invention.

EXAMPLE 2

Two tests were run to determine the minimum thickness of the secondary films which would effect interruption of the epitaxial growth of the tungsten metal grains in the primary films.

The test using a primary film flow duration of 3 seconds and a secondary film flow duration of 0.1 seconds indicated by visual examination of the topography and fracture surfaces of the sample that interruption had occurred. The sample, after electropolishing, had a measurable strength of 2238 MPa, confirming this indication. Estimating from deposition rates experienced in other tests, the secondary film thickness was calculated to be approximately 2 nm.

The test was repeated using a secondary film flow duration of 0.05 seconds. Similar visual examination of the sample topography and fracture surfaces suggested that the epitaxial growth had not been interrupted on most of the sample. The upstream 10% of length showed a smooth enough surface to suggest some interruption on this portion of the sample. In addition, microscopic examination of a section of a lower portion of the sample showed clearly the presence of columnar grains resembling ordinary CVD tungsten for the outermost ⅔ of the deposit, but a featureless deposit for the innermost ⅓.

Strength was measured at 379 MPa; actually lower than the base line material.

These tests indicated that the duration of 0.05 seconds secondary film precursor flow was not quite long enough and was marginally ineffective, in all probability because it produced too thin a secondary film. This latter secondary film thickness would have been estimated to be about 1.0 nm based on extrapolation of deposition rate data from earlier runs. This is in substantial agreement with the hypothesis offered above, having to do with the minimum thickness of secondary film required.

EXAMPLE 3

A test was conducted using the standard conditions described above. Tungsten chloride flowed continuously. Injections of propane gas to produce tungsten carbide were made, periodically. The primary film deposition flow duration was 3.0 seconds. The secondary film flow duration was 0.2 seconds, which is close to the minimum secondary film duration of deposition which had proved effective in interrupting the epitaxial growth of the primary film tungsten grains in the earlier tests, as shown in EXAMPLE 2. Using the dead-reckoning method, the thickness of the primary film was calculated to be 240 nm and that of the secondary film, 4 nm.

The ultimate strength was measured at 3503 MPa and the yield strength at 2566 MPa after electropolishing. The hardness was 8.0 GPa.

EXAMPLE 4

A run similar to that of EXAMPLE 3 was made. The same standard conditions were used. In this case, however, the primary film deposition flow, without propane injection, was shorter, for 1 second duration. The propane gas injection was for the same 0.2 seconds. The cycle was repeated for 5 hours.

Again using dead-reckoning, the thicknesses of the primary and secondary films were calculated to be 61 nm and 4 nm, respectively. Specimens were tested in three point bending after electropolishing. The ultimate strength was measured at 4440 MPa. The yield strength was 4172 MPa. The hardness ($HV_{1000}$) was 12.0 GPa. The results were as expected. The extreme grain refinement produced the high strength and the higher hardness than that shown in the run of EXAMPLE 3.

From both of these runs the difference provided by grain refinement produced by the method of the invention can be seen. These samples are between 4 and 5 times the strength of the conventional CVD samples of EXAMPLE 1. The specific modulus of resilience and the fracture energy are equivalently higher.

EXAMPLE 5

A run similar to that of EXAMPLE 3 was used to demonstrate the utility of a secondary film of different composition. Boron trichloride flow at a B/W atom ratio of 2.5 was used as the secondary film deposit precursor. Primary film flow duration was 10 seconds; secondary film flow duration was 0.5 seconds. As was expected, the grains in the sample refinement were not extraordinarily fine, but still quite small at 400-500 nm. The resultant sample was measured at an ultimate strength of 3324 MPa after electropolishing. This Example demonstrates the equivalence of tungsten boride with tungsten carbide in interrupting the epitaxial growth of the tungsten grains. Note again the high strength relative to the base-line material.

EXAMPLE 6

A test was conducted using the standard conditions described above. This test was similar to the tests of EXAMPLE 3. Tungsten chloride flowed continuously. Injections of propane gas to produce tungsten carbide were made, periodically. The primary film deposition flow, without propane injection, was for 2.3 seconds duration. The secondary film deposition was for a considerable longer time than in EXAMPLE 3, 6.0 seconds. The resultant material was, as expected, much harder than the samples of EXAMPLE 3. The hardness, measured with a 1000 g. load, averaged 21.6 GPa. Specimens were tested in three point bending after electropolishing.

The ultimate strength was measured at 3434 MPa. No yielding was observed. Metallographic examination of an etched section of the sample at 20,000× in a scanning electron microscope showed the average thickness of the primary layers to be 232 nm and that of the secondary layers to be 372 nm. This example demonstrates that the hardness will be increased by increasing the secondary film thicknesses without a disqualifying reduction in strength and toughness.

EXAMPLE 7

A test was conducted using the standard conditions. This test was also similar to the tests of EXAMPLES 3 and 4 except that a much longer primary film flow duration was used, 12 seconds. A short time, 0.2 seconds, was used for the secondary film flow duration of propane gas to produce tungsten carbide. These conditions produced the expected material which was somewhat softer than the samples of EXAMPLES 3 and 4 because they had a smaller proportion of carbide, and because they were not as fine-grained as the either the EXAMPLE 3 or 4 material. The hardness was 5.8 GPa. The grain size was dead reckoned to be approximately 1350 nm (1.35 μm). The strength, 3090 MPa, was still much higher than the base-line material, however.

EXAMPLE 8

A test was run with the objective of producing fine primary film thicknesses with a higher ratio of carbide to metal; to demonstrate that high hardness and high strength could be provided in the same sample. The same standard conditions were used. Primary film deposit duration was 0.8 seconds. Secondary film deposit duration was 0.5 seconds. The average couplet thickness was dead-reckoned at 34 nm. Using W and $W_2C$ deposition rates from earlier runs as a basis for calculation, film thicknesses were estimated as 19 nm for the primary and 15 nm for the secondary. The resulting samples had an average hardness of 20.2 GPa and an average strength of 4455 MPa. One sample showed a strength of 5172 MPa.

EXAMPLE 9

A run was made using the standard conditions, above. The timing was 3.0 seconds for the primary gas flow and 0.2 seconds for the secondary gas flow. The resultant specific gravity for the deposited material was 19.14 g/cc and the hardness 8.8 GPa. The as-deposited ultimate flexural strength was 1959 MPa. Note that this strength is more than twice that of the baseline material. A companion sample, ground with a 120 grit diamond wheel (116 µm), was tested at a strength of 1910 MPa. An identical sample from the same run was ground and electropolished to a specular finish (measured at an $R_a$ of 200 nm by atomic force microscopy). It tested at a much improved, flexural strength of 3090 MPa.

Another run was made using the same conditions except that the timing was 2.3 seconds for the primary film and 1.1 seconds for the secondary film. For this sample the specific gravity was 18.85 g/cc and the average hardness 14.3 GPa. The as-deposited ultimate flexural strength was 1635 MPa. A companion, and apparently identical, sample from the same run, as-ground with a coarse (120 grit) diamond wheel, (116 µm), demonstrated a strength of 1876 MPa. The strength of another companion sample, ground with a much finer, 1000 grit (9.2 µm), wheel having a more compliant binder, again producing a specular finish (measured at an $R_a$ of 200 nm.), was tested to a much higher strength of 3641 MPa.

This example demonstrated that the bulk strength of these fine-grained materials is best utilized when an excellent surface finish, to avoid surface defects, is provided.

EXAMPLE 10

A run was made which was similar to Runs 3 and 4 except that instead of propane ($C_3H_8$) gas for a secondary film deposition precursor, propylene ($C_3H_6$) was used. This precursor was clearly effective, resulting in a sample with a strength of 2414 MPa. It was interesting to note that the composition of the secondary film was different from those with the propane precursor, being WC instead of $W_2C$. Another run was made using methane gas, $CH_4$, for the secondary film precursor. It was also successful, producing a sample with a strength of 3319 MPa.

EXAMPLE 11

Two samples from the runs described in EXAMPLE 8 were subjected to a vacuum heat treat at 1500° C. for one hour. The first sample which had a hardness of 8.1 GPa, as-deposited, showed a hardness of 4.6 GPa after the heat treat. The strength of these samples which had been ground with a 400 grit (37 micron) wheel, and was, therefore, not as strong as electropolished samples, was reduced by the heat-treat from an as-finished value of 2317 MPa to 1697 MPa, still substantially better than the base-line material.

The second sample, which had a hardness of 14.0 GPa, as-deposited, demonstrated a softening to 5.0 GPa after the 1500° C. heat-treat. This sample, which had been ground with a standard 1000 grit (9.2 micron) wheel and electropolished, had an as-finished strength of 2690 MPa and a strength after heat-treat of 2200 MPa. Metallographic examination of etched cross-sections revealed that the layered structure ceases to exist, but that the material is composed of a fine grained mixture of tungsten and tungsten carbide. These observations indicate that the material is more resistant to recrystallization and grain coarsening than conventional tungsten materials, and thus maintains a higher strength after such elevated temperature exposures.

From the foregoing detailed description, it will be evident that there are a number of changes, adaptations, and modifications of the present invention which come within the province of those skilled in the art. The scope of the invention includes any combination of the elements from the different species or embodiments disclosed herein. However, it is intended that all such variations not departing from the spirit of the invention be considered as within the scope thereof.

What is claimed:

1. A method of making a high strength alloy, the method comprising the steps of:
    depositing a Group VIB transition metal to a thickness not greater than 1350 nm in a primary film by physical vapor deposition or chemical vapor deposition on a substrate;
    using the same deposition method to deposit an adherent film, different from the primary film, of metal or a semi-metal compound;
    wherein the deposited film of said metal or semi-metal compound is of a thickness sufficient to arrest the growth of the crystallites of the primary film and prevent epitaxial growth between adjoining primary films; and
    repeating alternate deposition of the primary film and the adherent film until a plurality of alternate films is made to the required thickness of the alloy.

2. The method of claim 1 wherein the deposition method comprises chemical vapor deposition.

3. The method of claim 1 wherein the Group VIB transition metal comprises tungsten.

4. The method of claim 1 wherein the metal or semi-metal compound comprises tungsten carbide.

5. The method of claim 1 wherein the metal or semi-metal compound comprises tungsten boride.

6. The method of claim 1, wherein repeating the alternate deposition is performed by switching on and off the flow of a secondary gas selected to react with a primary gas whose flow is on during deposition of both the primary film and the adherent film.

7. The method of claim 1, wherein the alternate deposition of the adherent Group VIB transition metal films and the adherent metal or semi-metal compound films is performed at a rate of at least 0.1 millimeter per hour.

8. The method of claim 1, wherein the alternate deposition of the adherent Group VIB transition metal films and the adherent metal or semi-metal compound films is performed at a rate of at least 1.0 millimeter per hour.

9. The method of claim 1, further including selecting a thickness of the adherent film to increase hardness without a disqualifying reduction in strength and toughness.

10. The method of claim 1, further including controlling a thickness of the adherent film by switching a gas valve.

11. The method of claim 1, wherein the required thickness is 0.1 millimeters or greater.

12. The method of claim 1, wherein the alloy is a Tungsten alloy having a Vickers Hardness Number of 20 GPa or more.

13. The method of claim 1, wherein the alloy is a Tungsten alloy having a Vickers Hardness Number of 20 GPa or more and a Flexural strength of over 5100 MPa.

14. The method of claim 1, wherein the alloy is a Tungsten alloy having a Vickers Hardness Number of 12 GPa to about 22 GPa.

15. The method of claim 1, wherein the alloy has a Vickers Hardness Number of 20 GPa or more.

16. The method of claim 1, wherein the alloy has a Vickers Hardness Number of 12 GPa to about 22 GPa.

17. The method of claim 1, wherein depositing the primary film is accomplished using a primary precursor gas and depositing the adherent film is accomplished by reacting a secondary gas with the primary precursor gas.

18. The method of claim 17, wherein the secondary gas includes carbon or boron.

19. The method of claim 1, wherein repeating the alternate deposition includes flushing gasses out of a deposition chamber between depositing the alternate films.

20. The method of claim 1, wherein a grain thickness of the Group VIB transition metal is 150-200 nm.

21. The method of claim 1, wherein a grain thickness of the Group VIB transition metal is 100-200 nm.

22. The method of claim 1, further including heating the substrate to between about 400 and 1100 degrees C.

23. The method of claim 1, further including selecting a temperature of the substrate to control a thickness of the adherent film.

24. The method of claim 1, wherein the adherent film has a crystal habit different from a habit of the metal of the primary film.

25. The method of claim 24, wherein the adherent film has limited solubility or reactivity with respect to said metal of the primary film at the deposition and use temperatures of the alloy.

26. The method of claim 1, wherein the primary film is deposited before the adherent film is deposited.

27. The method of claim 1, further including generating a precursor gas of the primary film in a same chamber as the substrate.

28. A method of making a high strength alloy comprising:
depositing a Group VIB transition metal in a primary film by physical vapor deposition or chemical vapor deposition on a substrate;
using the same deposition method to deposit an adherent film, different from the primary film, of metal or a semi-metal compound;
wherein the deposited film of said metal or semi-metal compound is of a thickness sufficient to arrest the growth of the crystallites of the primary film and prevent epitaxial growth between adjoining primary films;
repeating alternate deposition of the primary film and the adherent film until a plurality of alternate films is made to the required thickness of the alloy; and
wherein repeating the alternative deposition is performed by switching on and off a flow of gasses into a deposition chamber for periods of 12 seconds or less.

29. The method of claim 28, wherein the flow of gasses is switched on and off for periods of 3 seconds or less.

30. A method comprising:
depositing a Group VIB transition metal in a primary film by physical vapor deposition or chemical vapor deposition from a mixture of metal halides to form a solid solution alloy on a substrate;
using the same deposition method to deposit an adherent film, different from the primary film, of metal or a semi-metal compound;
wherein the deposited film of said metal or semi-metal compound is of a thickness sufficient to arrest the growth of the crystallites of the primary film and prevent epitaxial growth between adjoining primary films;
repeating alternate deposition of the primary film and the adherent film until a plurality of alternate films is made to the required thickness of the alloy.

31. A method of making a high strength alloy comprising:
depositing a Group VIB transition metal in a primary film by physical vapor deposition or chemical vapor deposition on a substrate;
using the same deposition method to deposit an adherent film, different from the primary film, of metal or a semi-metal compound;
wherein the deposited film of said metal or semi-metal compound is of a thickness sufficient to arrest the growth of the crystallites of the primary film and prevent epitaxial growth between adjoining primary films;
repeating alternate deposition of the primary film and the adherent film until a plurality of alternate films is made to a required thickness of the alloy of 1.0 millimeters or greater.

32. A method of making a high strength alloy comprising:
depositing a Group VIB transition metal in a primary film by physical vapor deposition or chemical vapor deposition on a substrate;
using the same deposition method to deposit an adherent film, different from the primary film, of metal or a semi-metal compound;
wherein the deposited film of said metal or semi-metal compound is of a thickness sufficient to arrest the growth of the crystallites of the primary film and prevent epitaxial growth between adjoining primary films;
repeating alternate deposition of the primary film and the adherent film until a plurality of alternate films is made to the required thickness of the alloy; and
removing the substrate from the alloy to produce a freestanding part.

33. A method of making a high strength alloy comprising:
depositing a Group VIB transition metal in a primary film by physical vapor deposition or chemical vapor deposition on a substrate;
using the same deposition method to deposit an adherent film, different from the primary film, of metal or a semi-metal compound;
wherein the deposited film of said metal or semi-metal compound is of a thickness sufficient to arrest the growth of the crystallites of the primary film and prevent epitaxial growth between adjoining primary films;
repeating alternate deposition of the primary film and the adherent film until a plurality of alternate films is made to the required thickness of the alloy; and
reducing a layered structure of the alternate films by heating the alloy to a recrystallization temperature.

34. A method of making a high strength alloy comprising:
depositing a Group VIB transition metal in a primary film by physical vapor deposition or chemical vapor deposition on a substrate;
using the same deposition method to deposit an adherent film, different from the primary film, of metal or a semi-metal compound;
wherein the deposited film of said metal or semi-metal compound is of a thickness sufficient to arrest the growth of the crystallites of the primary film and prevent epitaxial growth between adjoining primary films;
repeating alternate deposition of the primary film and the adherent film until a plurality of alternate films is made to the required thickness of the alloy; and
wherein forming the adherent film includes opening a gas valve for 3 seconds or less.

35. A method of making a high strength alloy, the method comprising the steps of:

depositing a transition metal in a primary film by physical vapor deposition or chemical vapor deposition on a substrate;

using the same deposition method to deposit an adherent film, different from the primary film, of metal or a semi-metal compound, wherein the deposited film of said metal or semi-metal compound is of a thickness sufficient to arrest the growth of the crystallites of the primary film and reduce epitaxial growth between adjoining primary films;

repeating alternate deposition of the primary film and the adherent film at least once such that a plurality of alternate films is made to the required thickness of the alloy, wherein the alternative deposition of the primary film and the adherent film is achieved by rapidly switching reactive gas flows; and removing the substrate from the alloy to produce a free-standing part.

* * * * *